(12) United States Patent
Lee et al.

(10) Patent No.: US 11,014,103 B2
(45) Date of Patent: May 25, 2021

(54) SUBSTRATE PROCESSING APPARATUS AND SUBSTRATE PROCESSING METHOD

(71) Applicant: TAIWAN SEMICONDUCTOR MANUFACTURING COMPANY LTD., Hsinchu (TW)

(72) Inventors: Yung-Yao Lee, Hsinchu County (TW); Wei-Hsiang Tseng, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/660,182

(22) Filed: Jul. 26, 2017

(65) Prior Publication Data

US 2019/0030550 A1 Jan. 31, 2019

(51) Int. Cl.
*B05D 3/12* (2006.01)
*H01L 21/67* (2006.01)
(Continued)

(52) U.S. Cl.
CPC ............ *B05B 3/1085* (2013.01); *B05D 1/005* (2013.01); *G03F 7/162* (2013.01);
(Continued)

(58) Field of Classification Search
CPC ................ B05D 1/005; H01L 21/6715; H01L 21/67248; H01L 21/67253; B05B 3/1085; G03F 7/162
(Continued)

(56) References Cited

U.S. PATENT DOCUMENTS 5,127,362 A * 7/1992 Iwatsu ...................... B05B 1/24
  118/52
5,670,210 A * 9/1997 Mandal .................. B05D 1/005
  427/240
(Continued)

FOREIGN PATENT DOCUMENTS

CN 1441923 A 9/2003
CN 1714426 A 12/2005
(Continued)

OTHER PUBLICATIONS

Office Action and Search Report dated Apr. 14, 2020 issued by the China Intellectual Property Office for counterpart application No. 201711252221.8.
(Continued)

*Primary Examiner* — Kirsten Jolley
(74) *Attorney, Agent, or Firm* — WPAT, P.C., Intellectual Property Attorneys; Anthony King

(57) ABSTRACT

Present disclosure provides a substrate processing apparatus, including a rotatable pedestal configured to hold a substrate, a driving mechanism connected to the rotatable pedestal, a liquid pouring nozzle over the pedestal, a temperature sensor configured to probe a temperature of the substrate processing apparatus, and a controller communicating with the temperature sensor and the driving mechanism. Present disclosure also provides a method for processing a substrate, including providing a substrate on a pedestal of a processing chamber, probing a temperature of the processing chamber, calculating a temperature difference between the temperature of the processing chamber and a predetermined temperature, and determining a rotational speed difference with respect to a predetermined rotational speed of the pedestal according to the temperature difference.

20 Claims, 11 Drawing Sheets

(51) Int. Cl.
    *B05B 3/10* (2006.01)
    *G03F 7/16* (2006.01)
    *B05D 1/00* (2006.01)
(52) U.S. Cl.
    CPC .... *H01L 21/6715* (2013.01); *H01L 21/67248* (2013.01); *H01L 21/67253* (2013.01)
(58) Field of Classification Search
    USPC ......................................................... 427/240
    See application file for complete search history.

(56) References Cited

U.S. PATENT DOCUMENTS

| | | | |
|---|---|---|---|
| 6,536,964 B1* | 3/2003 | Kitano | G03F 7/162 |
| | | | 118/52 |
| 8,796,666 B1 | 8/2014 | Huang et al. | |
| 9,012,132 B2 | 4/2015 | Chang | |
| 9,093,530 B2 | 4/2015 | Huang et al. | |
| 9,028,915 B2 | 5/2015 | Chang et al. | |
| 9,146,469 B2 | 9/2015 | Liu et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 9,646,898 B2 | 5/2017 | deVilliers et al. | |
| 2002/0112370 A1* | 8/2002 | Gurer | B05D 3/0254 |
| | | | 34/476 |
| 2008/0057194 A1* | 3/2008 | Tanaka | G03F 7/162 |
| | | | 427/240 |
| 2013/0224639 A1 | 8/2013 | Miyamoto et al. | |

FOREIGN PATENT DOCUMENTS

| | | |
|---|---|---|
| CN | 101044594 A | 9/2007 |
| EP | 1814144 | 6/2012 |
| WO | WO2001071425 A3 | 9/2001 |

OTHER PUBLICATIONS

Office Action and Search Report dated Oct. 24, 2018 issued by the Taiwan Intellectual Property Office (TIPO) for counterpart application No. 106141229.

* cited by examiner

| # | Temperature (°C) | Temperature Difference Δ(T) | Rotational Speed Difference Δ(ω) | Rotational Speed (rpm) |
|---|---|---|---|---|
| 1 | T1 | ΔT1 (T1-$T_{pre}$) | Δω1 | $ω_{pre}$+Δω1 |
| 2 | T2 | ΔT2 (T2-$T_{pre}$) | Δω2 | $ω_{pre}$+Δω2 |
| 3 | T3 | ΔT3 (T3-$T_{pre}$) | Δω3 | $ω_{pre}$+Δω3 |

FIG. 4

US 11,014,103 B2

SUBSTRATE PROCESSING APPARATUS AND SUBSTRATE PROCESSING METHOD

BACKGROUND

As is well known, products such as semiconductors, liquid crystal displays and the like are manufactured by performing a series of processes including cleaning, resist coating, exposure, development, etching, formation of interlayer insulation film, thermal treatment, dicing and the like on the above-discussed substrates.

A conventional photoresist pattern forming process, which is one of semiconductor device fabricating processes, includes the steps of forming a resist film on a surface of a semiconductor wafer (hereinafter, referred to simply as "wafer") by applying a resist to the surface of the wafer, exposing the resist film in a predetermined pattern, and developing the exposed resist film. Generally, this photoresist pattern forming process is carried out by a system built by connecting an exposure system to a coating and developing system.

A resist film is formed on the surface of a layer as a mask for a pattern portion when a semiconductor layer, an insulating layer, or an electrode layer formed on a semiconductor wafer is to be etched into a predetermined pattern.

For example, spin coating is known as a method of forming a resist film. According to this method, a table is rotated with a semiconductor wafer being placed and fixed thereon. For example, a resist solution consisting of a solvent and a photo-sensitive resin is dropped on the central portion of the upper surface of the wafer. The resist solution is spirally diffused from the central position of the wafer to its peripheral portion in accordance with the rotational and centrifugal forces of the wafer, thereby coating the resist solution on the semiconductor wafer.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 4 is a spread sheet showing a correlation between a temperature difference and the corresponding rotational speed difference, in accordance with some embodiments of the present disclosure.

Like reference symbols in the various drawings indicate like elements.

DETAILED DESCRIPTION OF THE DISCLOSURE

Figure 1:
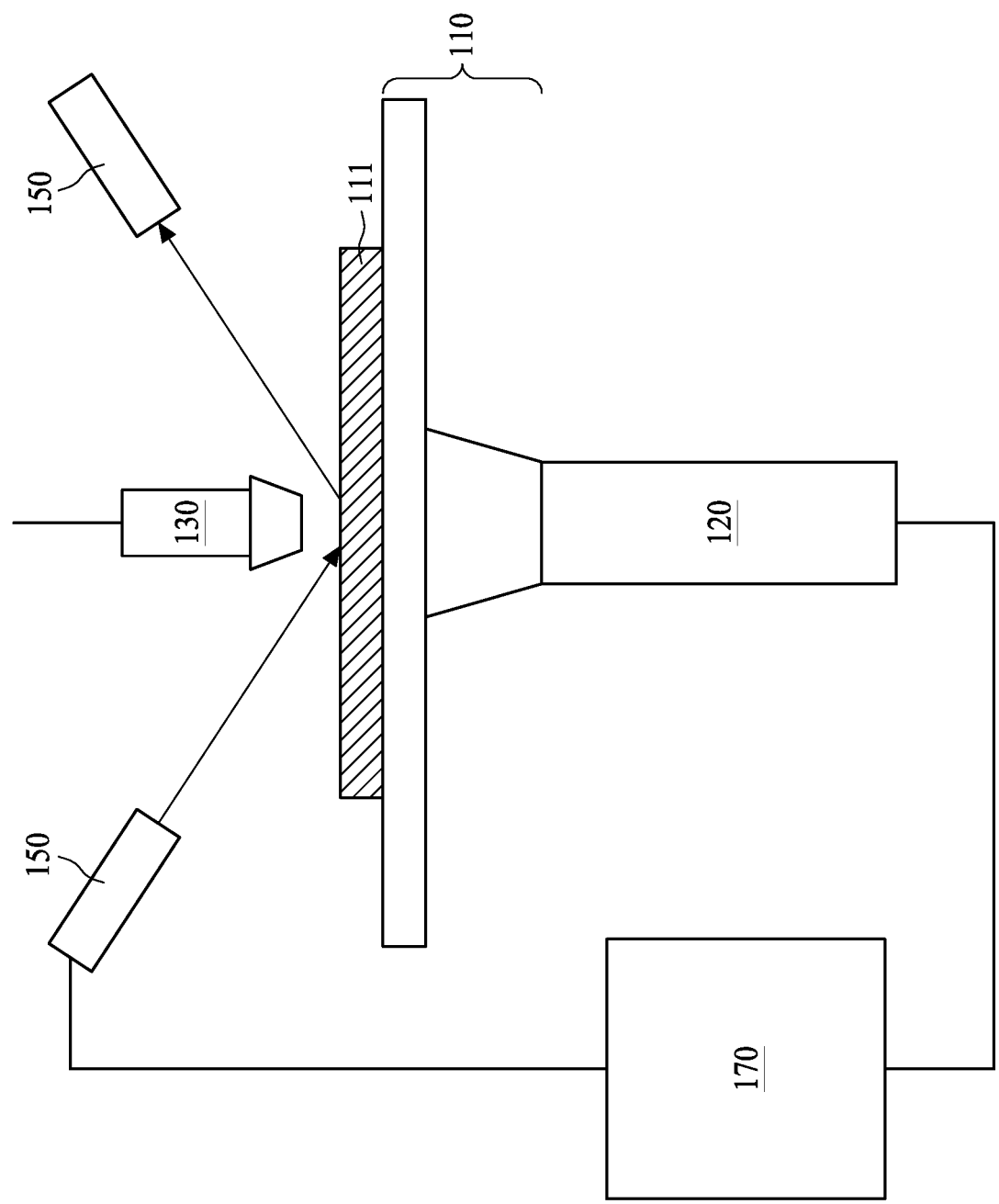
FIG. 1 is a cross sectional view showing a substrate processing apparatus, in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Integrated circuits are typically constructed by depositing a series of individual layers of predetermined materials on a wafer shaped semiconductor substrate, or "wafer". The individual layers of the integrated circuit are in turn produced by a series of manufacturing steps. For example, in forming an individual circuit layer on a wafer containing a previously formed circuit layer, an oxide, such as silicon dioxide, is deposited over the previously formed circuit layer to provide an insulating layer for the circuit. A pattern for the next circuit layer is then formed on the wafer using a radiation alterable material, known as photoresist.

Photoresist materials are generally composed of a mixture of organic resins, sensitizers and solvents. Sensitizers are compounds, such as diazonaphthaquinones, that undergo a chemical change upon exposure to radiant energy, such as visible and ultraviolet light resulting in an irradiated material having differing salvation characteristics with respect to various solvents than the nonirradiated material. Resins are used to provide mechanical strength to the photoresist and the solvents serve to lower the viscosity of the photoresist so that it can be uniformly applied to the surface of the wafers. After a photoresist layer is applied to the wafer surface, the solvents are evaporated and the photoresist layer is hardened, usually by heat treating the wafer. The photoresist layer is then selectively irradiated by placing a radiation opaque mask containing a transparent portion defining the pattern for the next circuit layer over the photoresist layer and then exposing the photoresist layer to radiation. The photoresist layer is then exposed to a solvent, known as developer, in which either the irradiated or the nonirradiated photoresist is soluble, which removes the photoresist in the pattern defined by the mask, selectively exposing portions of the oxide insulating layer. The exposed portions of the insulating layer are then selectively removed using an etchant to expose corresponding sections of the underlying circuit layer. It is important that the remaining photoresist be resistant to the etchant, so as to limit the attack of the etchant to only the exposed portions of the insulating layer. Following the etching process, the next circuit is deposited and the remaining photoresist is stripped from the surface of the wafer typically through the use of a solvent.

Photoresist and developer materials are typically applied to the wafer using a spin coating technique in which the photoresist is sprayed on the surface of the wafer as the wafer is spun on a rotating chuck. The spinning of the wafer distributes the photoresist over the surface of the material and exerts a shearing force that separates the excess photoresist from the wafer thereby providing a thin layer of photoresist on the surface of the wafer. It is necessary to produce a highly uniform photoresist layer to enable the subsequent circuit layers to be precisely placed on the wafer; however, a number of process conditions, such as photoresist temperature, system temperature, photoresist dispensing velocity, rotational speed, system air flow and solvent evaporation rate, greatly affect the characteristics of the photoresist layer.

Among the various process conditions, rotational speed is highly related to the coating thickness of the photoresist. Especially in advanced technology node, such as 10 nm, 7 nm, or 5 nm technology nodes, stringent critical dimension demand can only be achieved by accurate photoresist coating thickness control, leaving a low variation margin of the coating thickness. In other words, poor photoresist coating thickness control undermines critical dimension of the manufacture, ending up deteriorating product yield.

Conventionally a rotational speed to distribute the photoresist is a predetermined factor. For example, a storage device of a spin coater may store a predetermined rotational speed schedule that contains a plurality of different rotational speeds for various photoresist distribution stages. However, the stored rotational speed schedule is predetermined and cannot be changed without operator's intervention. That is to say, the conventional rotational speeds, $\omega 1$, $\omega 2$, ... $\omega N$, are not floating values complying with any feedback mechanism. Due to the nature of conventional rotational speed schedule being purely mechanical, 1-dimensional approach is used herein to describe the conventional rotational speed pattern.

Present disclosure incorporate the effect temperature has on photoresist coating thickness. For example, if a coating thickness of 2300 Angstrom is desired, applying a same rotational speed, for example, 5250 round per minute (rpm), for a specified photoresist under different temperatures on different wafers would not obtain the same coating thickness. Currently temperature difference in the processing chamber of a spin coater could be controlled within a certain variation range, for example, ±1° C., ±5° C., ±10° C., nevertheless, a slight temperature difference such as ±0.5° C. could deviate coating thickness from target values. Therefore, present disclosure provides a 2-dimensional approach that incorporates the temperature as one of the feedback factors to the rotational speed without operator's intervention.

Referring to FIG. 1, FIG. 1 is a cross sectional view showing a substrate processing apparatus 10, in accordance with some embodiments of the present disclosure. A pedestal 110 is connected to a driving mechanism 120, for example, a motor, for executing a spinning operation. In some embodiments, the pedestal 110 is a vacuum chuck applying vacuum suction to a bottom surface of a substrate 111 such that the substrate 111 is oriented in horizontal plane with the top surface of the substrate 111 facing upwards. The pedestal 110 along with the driving mechanism 120 is configured to rotate about a central axis thereof such that the substrate 111 achieve a predetermined rotational speed. In the present embodiment, the predetermined rotational speed is in the range of approximately 3000-7000 rpm. Although such a speed is used in the present embodiment, the present claimed invention is also well suited to numerous variations in the predetermined rotational speed. In some embodiments, the vacuum chuck has a shaft interlocked with the driving mechanism 120. The driving mechanism 120 drives the vacuum chuck holding the substrate for rotation and vertical movement.

The substrate 111 to be processed by the coating and developing system of the present invention is not limited to a wafer and the coating and developing system of the present disclosure is applicable to processing, for example, a substrate for a LCD and a substrate for forming a reticle, namely, a photomask, by coating and developing processes.

A liquid pouring nozzle 130 is placed over the top surface of the substrate 111, configured to pour liquid, such as photoresist, onto the top surface of the substrate 111. In some embodiments, a first and second dispense lines (not shown in FIG. 1) are identical cylindrical tubular lines having dispense ends and a uniform cross sectional dimension perpendicular to the direction of flow. The first and second dispense lines are aligned in parallel and the dispense ends are directed substantially perpendicular toward the top surface of the substrate 111. The dispense lines are preferably constructed of stainless steel, although any material of suitable strength and rigidity can be used with the scope of the invention. Alternatively, the first and second dispense lines do not have to be identical or aligned in parallel, but can be varied to achieve the result desired by the skilled practitioner. In addition, it may be desirable to include additional dispense lines to ensure complete coverage of a large surface area where it would be inefficient and impractical to coat the surface using only one dispense line.

The liquid pouring nozzle 130 can be moved toward and away from the substrate 111. In some embodiments, a dispense line has one end connected to the pouring nozzle 130 and the other end connected to a selector valve connected to a water-repellent solution source, a solvent source, such as a thinner source for supplying a thinner for dissolving a resist, and a nitrogen gas source for supplying nitrogen gas for purging the dispense line The selector valve connects the dispense line selectively to the water-repellent solution source, the solvent source, or the nitrogen gas source. Valves are placed in the dispense line connected to the pouring nozzle 130. The pouring nozzle 130 can be horizontally and vertically moved by a lifting mechanism (not shown). In some embodiments, the substrate processing apparatus 10 is a coating unit provided with both a resist film forming means and a water-repellent film forming means in this example. In other embodiments, the resist film forming means and the water-repellent film forming means may be included in separate coating units, respectively.

In some embodiments, the substrate processing apparatus 10 includes a coating unit as described and a developing unit. Although not shown in the figures of present disclosure, developing unit will be briefly described below. A spin chuck holds a central part of a substrate seated thereon in a horizontal position by suction. The spin chuck holding the substrate can be rotated and can be vertically moved. An elongate developer pouring nozzle provided with a straight developer pouring slit is disposed opposite to the upper surface of the substrate. The length of the developer pouring slit is equal to or greater than the diameter of the substrate. A driving mechanism moves the developer pouring nozzle horizontally and vertically.

A temperature sensor 150 is equipped in the substrate processing apparatus 10. In some embodiments, the temperature sensor 150 is a non-contact infrared temperature sensors or radiometers. Advantageously, the non-contact infrared temperature sensors do not require surface contact. Instead, they use an infrared sensor which receives infrared energy from a target area on the surface of an object where a temperature reading is desired. In some embodiments, a laser aiming system and a scope assembly are provided in the temperature sensor 150. The scope assembly includes a lens system that can be used to focus incoming visible light from the focal area. Incoming visible light is reflected by a beam splitter situated in the sensor housing toward the scope assembly, and incoming infrared radiation is transmitted through the beam splitter to be received by an infrared detector. A mirror then reflects the visible light received by the scope assembly from the beam splitter into the lens system where it is focused for viewing by the operator. The laser aiming system includes an adjustable mirror situated in the housing along the optical axis, which provides for aiming the laser beam toward the target area along the optical axis through a small opening in the beam splitter aligned with the optical axis. In FIG. 1, the temperature sensor 150 aims at the top surface of the substrate 111, however, this is not a limiting factor to the present disclosure. The temperature sensor 150 can be aimed to other locations in the processing chamber of the processing apparatus 10. For example, the temperature sensor 150 can be aimed to a chamber wall (not shown in FIG. 1) or to a top surface of the pedestal 110.

A controller 170 is devised in the substrate processing apparatus 10 to communicate with the temperature sensor 150 and the driving mechanism 120. The controller 170 controls the driving mechanism 120 to rotate the spin chuck 110 at a predetermined rotating speed for a predetermined time. Detailed operation of the controller 170 is described in the following paragraph addressing FIG. 2 and can be referred thereto. In brief, the controller 170 receives a first signal from the temperature sensor 150, processes the first signal to obtain a second signal, and outputs the second signal to the driving mechanism 120.

Figure 2:
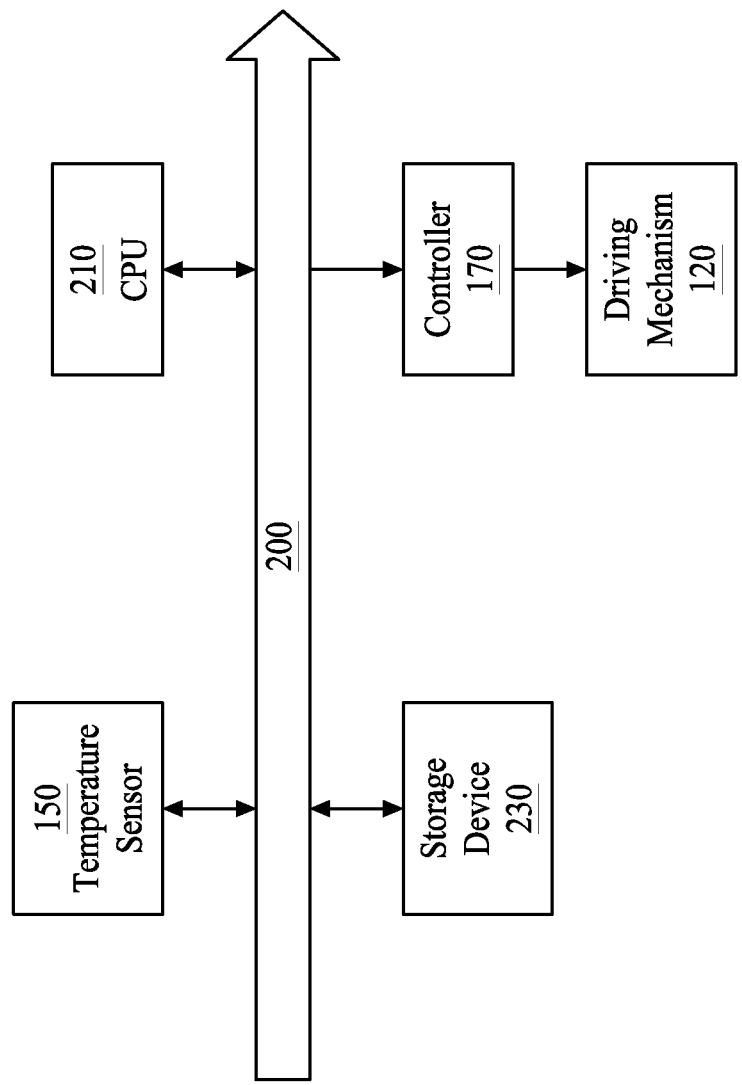
FIG. 2 is a block diagram showing the function of the substrate processing apparatus, in accordance with some embodiments of the present disclosure.

Referring to FIG. 2, FIG. 2 is a block diagram 20 of assistance in explaining the function of the substrate processing apparatus 10, in accordance with some embodiments of the present disclosure. The temperature sensor 150, a CPU 210, the controller 170, and a storage device 230 are communicating to each other through a bus 200. The storage device 230 stores predetermined values specifying rotational speeds and temperatures. For example, the substrate processing apparatus 10 sets the rotational speed of the driving mechanism 120 at a predetermined value, $\omega_{pre}$, and the temperature at a predetermined value $T_{pre}$. $\omega_{pre}$ and $T_{pre}$ are both stored at the storage device 230 ready to be edited. Once the temperature sensor 150 obtain a measured temperature T1 from any location of the processing chamber, T1 and $T_{pre}$ are compared in the controller 170 and a temperature difference $\Delta T1$ is obtained. The controller then correlates the temperature difference $\Delta T1$ with a rotational speed difference $\Delta \omega 1$ according to a correlation sheet stored in the storage device 230. Next, the rotational speed difference $\Delta \omega 1$ is added to the predetermined rotational speed $\omega_{pre}$ and output the sum of $(\omega_{pre}+\Delta \omega 1)$ to the driving mechanism 120. In some embodiments, CPU 210 may or may not have involvement with the aforesaid process. In some embodiments, the storage device 230 includes one or more units storing predetermined values and correlation sheet.

Figure 3:
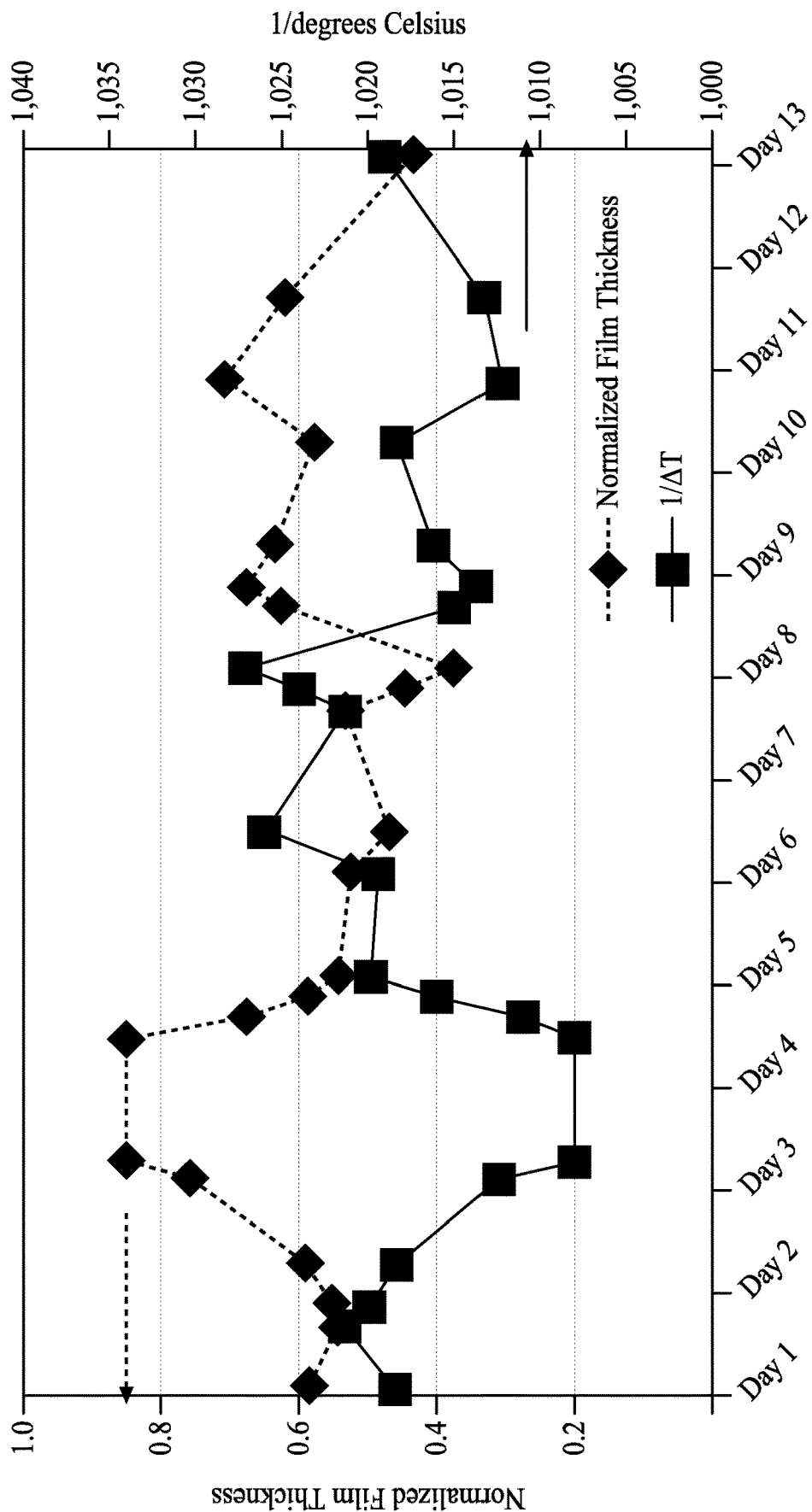
FIG. 3 is a plot showing under a fixed rotational speed, the normalized film thicknesses and corresponding reciprocal temperature differences with respect to various measuring dates, in accordance with some embodiments of the present disclosure.

Referring to FIG. 3, FIG. 3 is a plot showing under a fixed rotational speed, the normalized film thicknesses, e.g., the photoresist coating thickness, and corresponding reciprocal temperature differences ($1/\Delta T$) with respect to various measuring dates (Day 1, Day 2, . . . Day 13), in accordance with some embodiments of the present disclosure. In some embodiments, FIG. 3 is an illustration of the information on the correlation sheet stored in the storage device 230. It is shown in FIG. 3 that under a fixed rotational speed, the greater the temperature difference $\Delta T$, the smaller the reciprocal value ($1/\Delta T$), and the greater the film thickness. For example, in day 3, a reciprocal value ($1/\Delta T$) of 1007.5 corresponds to a normalized film thickness more than 0.8, whereas in day 8, a reciprocal value ($1/\Delta T$) of 1027.5 corresponds to a normalized film thickness of less than 0.4. From the information of FIG. 3, one is able to conclude that in order to achieve a desired film thickness in different dates having different temperature conditions, either the temperature of the processing chamber or the rotational speed could be adjusted. However, adjusting the temperature of the processing chamber is time-consuming and thus production throughput would be deteriorated. Since the film thickness, t, is known to be inversely proportional with the square root of rotational speed ($t \propto 1/\sqrt{\omega}$), the film thickness variation due to temperature difference $\Delta T$ could be compensated by adjusting the rotational speed $\omega$.

Referring to FIG. 4, FIG. 4 is a spread sheet showing a correlation between a temperature difference $\Delta T$ and the corresponding rotational speed difference $\Delta \omega$, in accordance with some embodiments of the present disclosure. In some embodiments, the number 1-3 of each row represent different substrates. For substrate No. 1, a temperature T1 is measured by the temperature sensor 150, and a temperature difference $\Delta T1$ is being calculated in the controller 170. In some embodiments, the temperature difference $\Delta T1$ is within a range of $\pm 1°$ C., $\pm 0.5°$ C., or $\pm 0.1°$ C. The controller 170 then correlates such temperature difference $\Delta T1$ with a rotational speed difference $\Delta \omega 1$ by referencing to the correlation sheet stored in the storage device 230, adds the rotational speed difference $\Delta \omega 1$ to the predetermined rotational speed $\omega_{pre}$ preset and stored in the storage device 230, and outputs the sum of $(\omega_{pre}+\Delta \omega 1)$ to the driving mechanism 120. One of the correlating operations referencing to the information in FIG. 3 is described below. Once the temperature difference $\Delta \omega 1$ is obtained, the corresponding coating thickness could be looked up. If the corresponding coating thickness is thicker than desired, increasing the predetermined rotational speed $\omega_{pre}$ by $\Delta\omega 1$ can be mathematically determined. In the contrary, if the corresponding coating thickens is thinner than desired, decreasing the predetermined rotational speed $\omega_{pre}$ by $\Delta\omega 1'$ can be mathematically determined.

Similar operations repeat to apply to the substrate No. 2 and substrate No. 3 and so on. In some embodiments, the temperature differences $\Delta T1$, $\Delta T2$, and $\Delta T3$ are different, and hence the corresponding rotational speed differences $\Delta\omega 1$, $\Delta\omega 2$, and $\Delta\omega 3$ are different, respectively. Normally the differences between subsequent substrates, say $\Delta T1$ and $\Delta T2$, are small but not negligible. Under the condition that differences, say $\Delta T1$ and $\Delta T2$, are small enough, operator could change the setting by measuring the temperature T1 only at the first substrate of each batch and utilize the rotational speed difference $\Delta\omega 1$ on every substrate of said batch without further temperature measurement and rotational speed adjustment.

Figure 5:
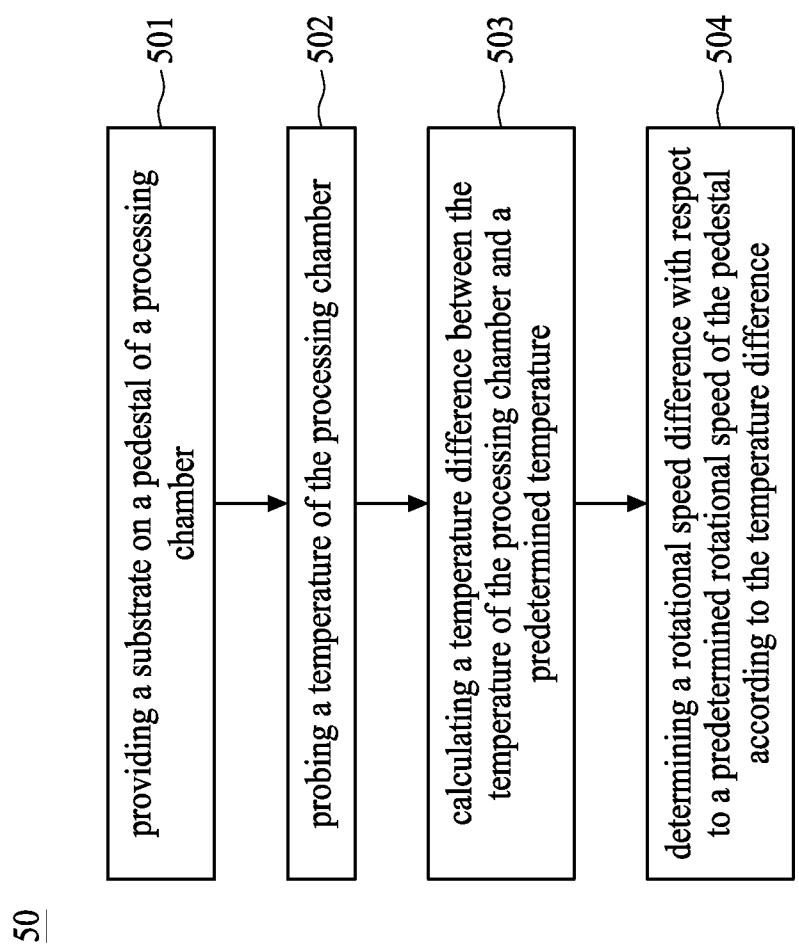
FIG. 5 is a process flow of a method for processing a substrate, in accordance with some embodiments of the present disclosure.

Referring to FIG. 5, FIG. 5 is a process flow 50 of a method for processing a substrate, in accordance with some embodiments of the present disclosure. The process flow 50 includes operation 501, providing a substrate 111 on a pedestal 110 of a processing chamber; operation 502, probing a temperature of the processing chamber; operation 503, calculating a temperature difference between the temperature of the processing chamber and a predetermined temperature; and operation 504, determining a rotational speed difference with respect to a predetermined rotational speed of the pedestal according to the temperature difference.

In operation 501, a substrate 111 is provided on a pedestal 110 for a spin dry operation. The vacuum chuck or the pedestal 110 serves as both a substrate holding device and a drying device which spin-dries a substrate by rotating the substrate at a high rotating speed to shake of a liquid, such as water, adhering to a surface of the substrate by centrifugal force. In some embodiments, a cup structure having an open upper end is disposed so as to surround the substrate held by the pedestal 110. A lower part of the cup structure is bent so as to form a liquid containing space extending under an edge part of the substrate 111. In some embodiments, the substrate 111 is transferred to and from the pedestal 110 by the cooperative operation of, for example, the substrate carrying device and lifting pins.

As previously discussed, in operation 502, a temperature of a chamber wall, a temperature of a top surface of the pedestal 110, or a temperature of a top surface of the substrate 111 can be probed by the temperature sensor 150. In some embodiments, when the temperature of a top surface of the substrate 111 is being probed, the probing operation is carried out when there is no water or photoresist on the top surface of the substrate 111. The infrared temperature sensor 150 aims at a specific zone of the top surface of the substrate 111 without penetrating water or photoresist materials, thereby an accurate temperature of the substrate 111 could be obtained. In some embodiments, the temperature probing operation is carried out after the spin dry operation and prior to a liquid dispensing operation, for example, dispensing photoresist from the pouring nozzle 130.

In operation 503, as previously discussed, a temperature T1 from any location of the processing chamber is measured by the temperature sensor 150, and a temperature difference$\Delta T1$ is being calculated in the controller 170. In some embodiments, the temperature difference$\Delta T1$ is within a range of ±1° C., ±0.5° C., or ±0.1° C. One embodiment of calculating the temperature difference$\Delta T1$ is to subtract the predetermined temperature $T_{pre}$ from the measured temperature T1, hence, the temperature difference$\Delta T1$ can be a positive or a negative value. In some embodiments, when the temperature T1 is determined to be greater than the predetermined temperature $T_{pre}$, that is, when the temperature difference$\Delta T1$ is a positive value, generate a positive rotational speed difference ($\Delta\omega 1>0$). In some embodiments, when the temperature T1 is determined to be lower than the predetermined temperature $T_{pre}$, that is, when the temperature difference$\Delta T1$ is a negative value, generate a negative rotational speed difference ($\Delta\omega 1<0$).

In operation 504, a rotational speed difference $\Delta\omega 1$ is determined according to the temperature difference$\Delta T1$ obtained in operation 503. In one embodiment, the rotational speed difference $\Delta\omega 1$ is correlated from the temperature difference$\Delta T1$ by referencing to a correlation sheet as shown in FIG. 3. As previously discussed, once the temperature difference$\Delta T1$ is obtained, the corresponding coating thickness could be looked up from the correlation sheet. If the corresponding coating thickness is thicker than a desired value, increasing the predetermined rotational speed $\omega_{pre}$ by $\Delta\omega 1$ can be mathematically determined. In the contrary, if the corresponding coating thickness is thinner than a desired value, decreasing the predetermined rotational speed $\omega_{pre}$ by $\Delta\omega 1'$ can be mathematically determined. Each correlation sheet contains information between temperature difference and the coating film thickness for a photoresist with specified viscosity. In some embodiments, an additional operation before referencing to the correlation sheet is to determine the viscosity of the liquid (photoresist) dispensing from the pouring nozzle 130 by, for example, manually entering the viscosity of the liquid (photoresist) so that the corresponding correlation sheet with such viscosity can be properly selected.

Following operation 505, the controller 170 then adds the rotational speed difference $\Delta\omega 1$ to the predetermined rotational speed $\omega_{pre}$, and outputs the sum of ($\omega_{pre}+\Delta\omega 1$) to the driving mechanism 120 in order to spin the pedestal 110 at the adjusted rotational speed ($\omega_{pre}+\Delta\omega 1$). Compared to the aforesaid 1-dimensional approach where the rotational speed is not adjusted through a feedback mechanism, the 2-dimensional approach with adjusted rotational speed ($\omega_{pre}+\Delta\omega 1$) provides a more accurate photoresist coating thickness and hence the thickness uniformity within wafer-to-wafer and lot-and-lot can be enhanced. The method of the present claimed invention has been found to improve uniformity over prior art photoresist coating methods. That is, in prior art photoresist layers the difference in the thickness among all substrates in a batch will vary by as much as a hundred angstroms. However, in photoresist layers formed by the method of the present disclosure, the variation is typically in the range of approximately 10 angstroms.

Figure 7:
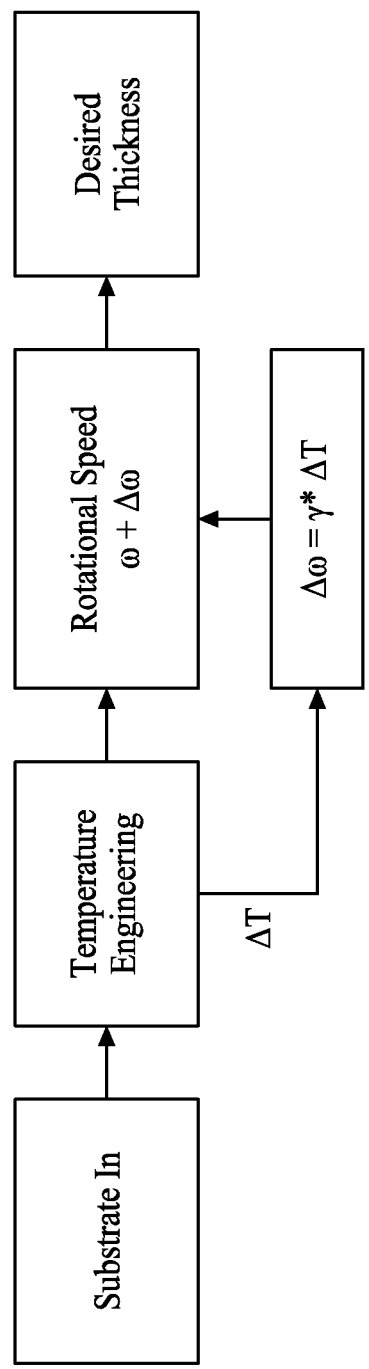
FIG. 7 is a block diagram showing a method for processing a substrate, in accordance with some embodiments of the present disclosure.

With reference to FIG. 7, the process flow 50 can be further illustrated in a block diagram. The temperature engineering operation corresponds to operation 502 to operation 504 as previously described and is not repeated here for brevity. As previously provided, once the temperature difference$\Delta T1$ is obtained, the corresponding coating thickness could be looked up.

If the corresponding coating thickness is thicker than desired, increasing the predetermined rotational speed $\omega_{pre}$ by $\Delta\omega 1$ can be mathematically determined. In the contrary, if the corresponding coating thickness is thinner than desired, decreasing the predetermined rotational speed $\omega_{pre}$ by $\Delta\omega 1'$ can be mathematically determined. The correlation between the temperature difference $\Delta T$ and the rotational speed difference $\Delta\omega$ can be formulated by the following equation, wherein $\gamma$ is an empirical constant.

$$\Delta\omega=\gamma\Delta T$$

In some embodiments, the aforesaid operations can be applied on a substrate-to-substrate basis. The rotational speed for each substrate is adjusted thorough the temperature probing operation. People having ordinary skill in the art would understand that in order to evenly spread the photoresist across the surface of the substrate, a rotational speed schedule including multiple rotational speeds may be applied. For example, the substrate is accelerated at a constant rate in the range of approximately 100-500 rpm/sec from rotational speed to another rotational "spread" speed. In the present embodiment, the spread speed is in the range of approximately 800-1500 rpm. The substrate is then maintained at the spread speed for in the range of approximately 3-7 seconds, such that the photoresist material previously deposited onto the wafer is spread in a uniform layer over the top surface of the semiconductor wafer. That is, any photoresist material which has accumulated in the center portion of the substrate during the dispensing step, especially as the wafer approached the slower rotational speed, will be evenly distributed over the entire top surface of the substrate. As a result, a photoresist layer of uniform "target" thickness is formed across the top surface of the substrate. In the present embodiment, the target thickness is in the range of approximately 1-2 microns. However, the present claimed invention is also well suited to obtaining uniform layers of photoresist having numerous different target thicknesses. In some embodiments, the aforesaid operations are carried out before the rotational speed and again before the spread speed.

In the final step of the method of the present disclosure, after rotating the semiconductor wafer at the spread speed for a few seconds, the substrate is accelerated at a constant rate in the range of approximately 5000 rpm/sec from the spread speed to a drying speed. In the present embodiment, the drying speed is in the range of approximately 5000 rpm. In the present embodiment, the substrate is maintained at the drying speed for in the range of approximately 6-8 seconds such that the uniform layer of the photoresist material on the top surface of the substrate is dried.

Figure 6:
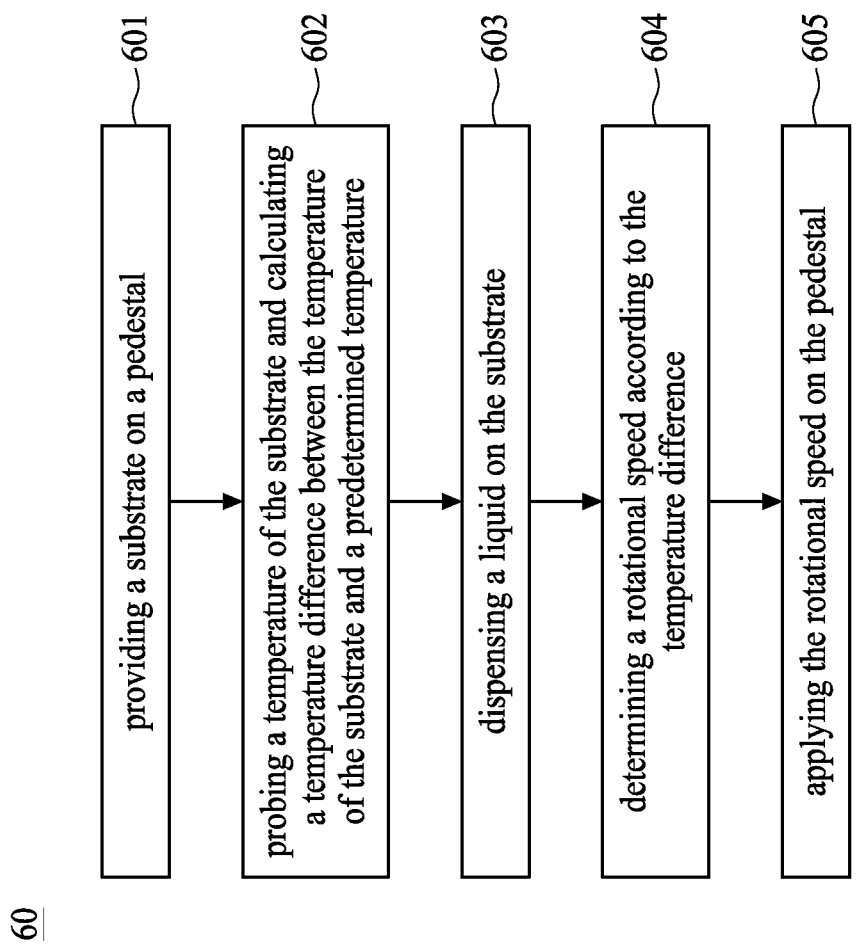
FIG. 6 is a process flow of a method for dispensing a liquid on a substrate, in accordance with some embodiments of the present disclosure.

Referring to FIG. 6, FIG. 6 is a process flow 60 of a method for dispensing a liquid on a substrate, in accordance with some embodiments of the present disclosure. The process flow 60 includes operation 601, providing a substrate on a pedestal; operation 602, probing a temperature of the substrate and calculating a temperature difference between the temperature of the substrate and a predetermined temperature; operation 603, dispensing a liquid on the substrate; operation 604, determining a rotational speed according to the temperature difference; and operation 605, applying the rotational speed on the pedestal.

Figure 9:
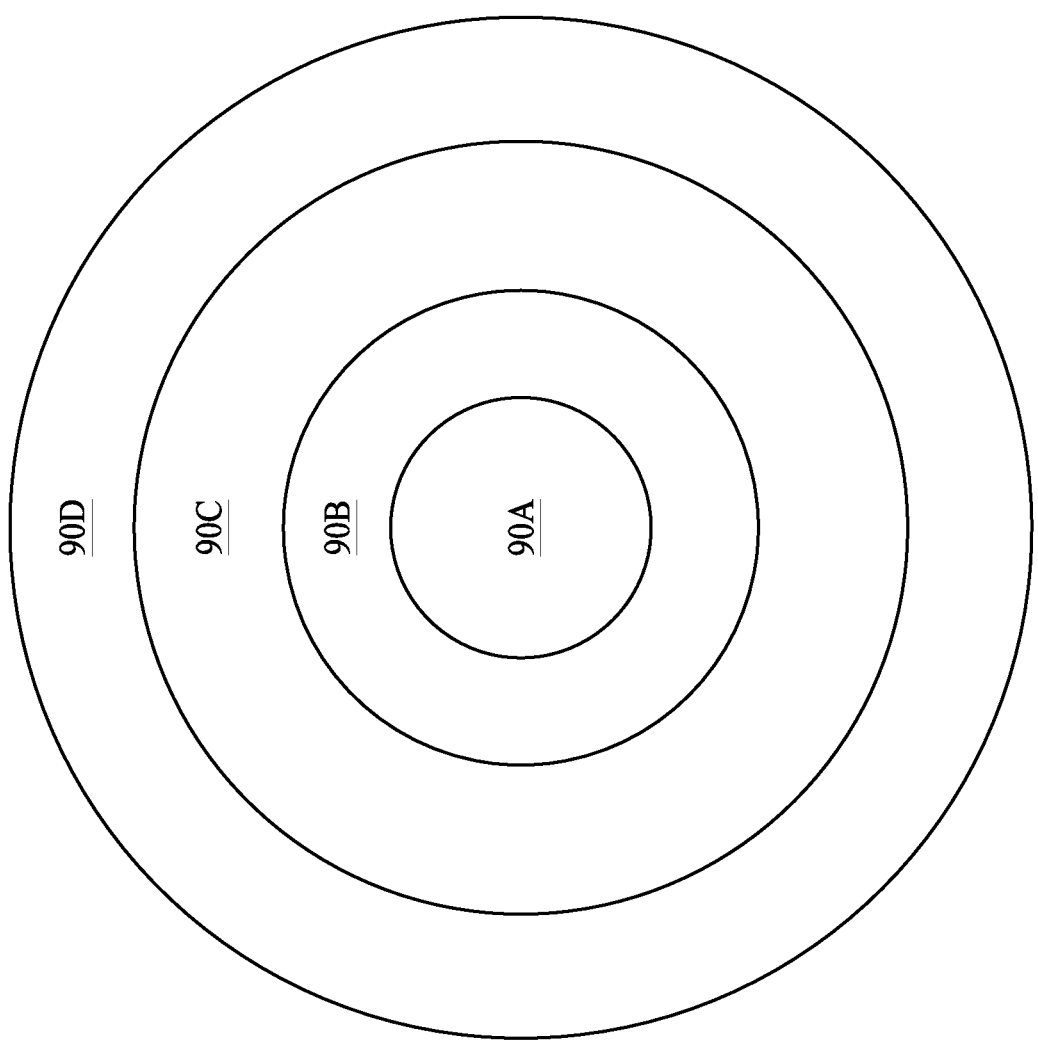
FIG. 9 is a top view showing different zones in a substrate to be processed, in accordance with some embodiments of the present disclosure.

In operation 602, probing temperatures on different zones of the substrate can be carried out. For example, in the first probing operation, the temperature sensor 150 aims at a first zone 90A of the substrate to obtain a first temperature T1, as shown in FIG. 9. In the subsequent probing operation, the temperature sensor 150 aims at a second zone 90B of the substrate to obtain a second temperature T2. In the subsequent probing operation, the temperature sensor 150 aims at a third zone 90C of the substrate to obtain a third temperature T3. In the subsequent probing operation, the temperature sensor 150 aims at a fourth zone 90D of the substrate to obtain a fourth temperature T4. The four probing operations are conducted before the aforesaid operation 603. In FIG. 9, the first zone 90A encloses a center of the substrate, and the second zone 90B, the third zone 90C, the fourth zone 90D circumference the previous zone in a concentric manner. Multiple temperature probing is to enhance the probing accuracy of the temperature of the substrate. After probing a number of desired zones on the substrate, the liquid is dispensed over the top surface of the substrate while the controller is averaging all the temperatures probed T1, T2, T3, and T4.

Figure 10:
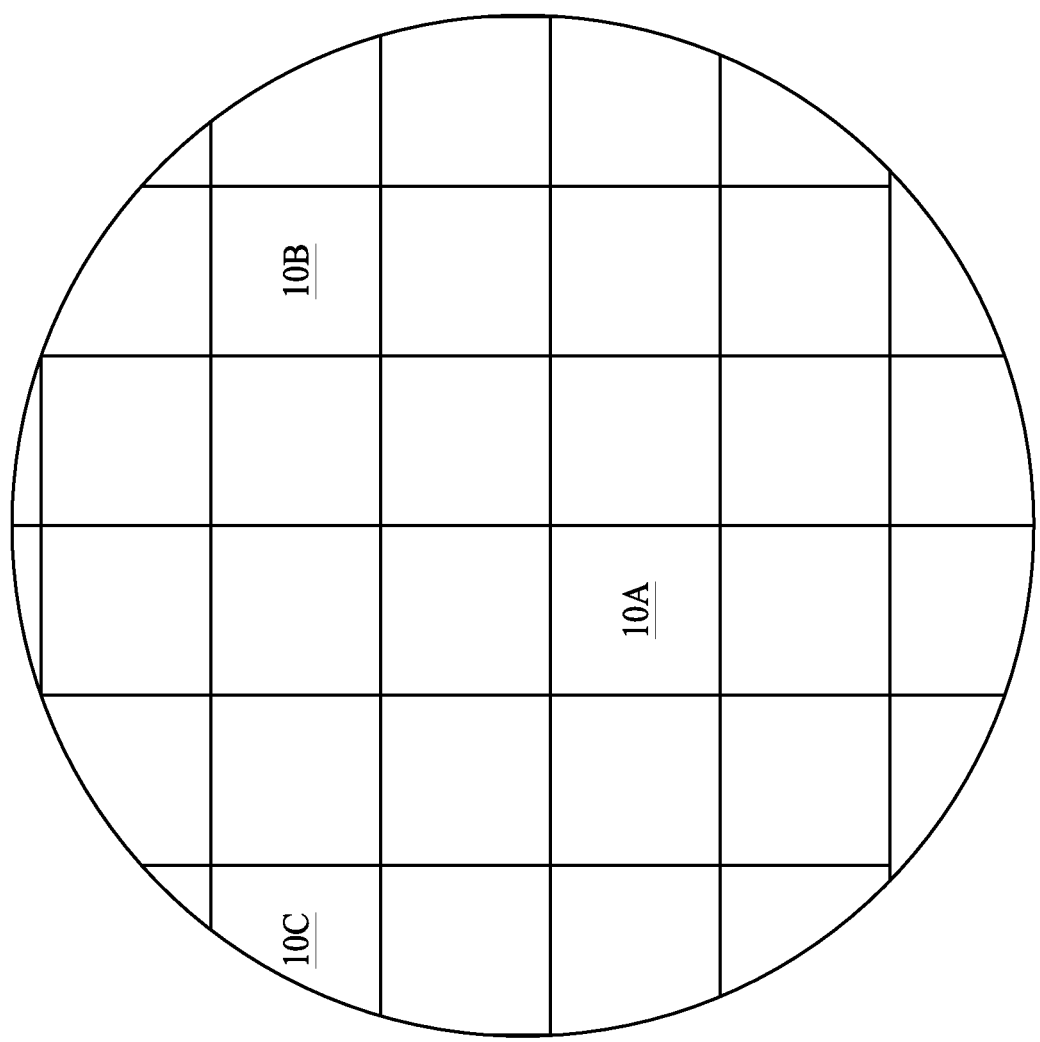
FIG. 10 is a top view showing different zones in a substrate to be processed, in accordance with some embodiments of the present disclosure.
Figure 11:
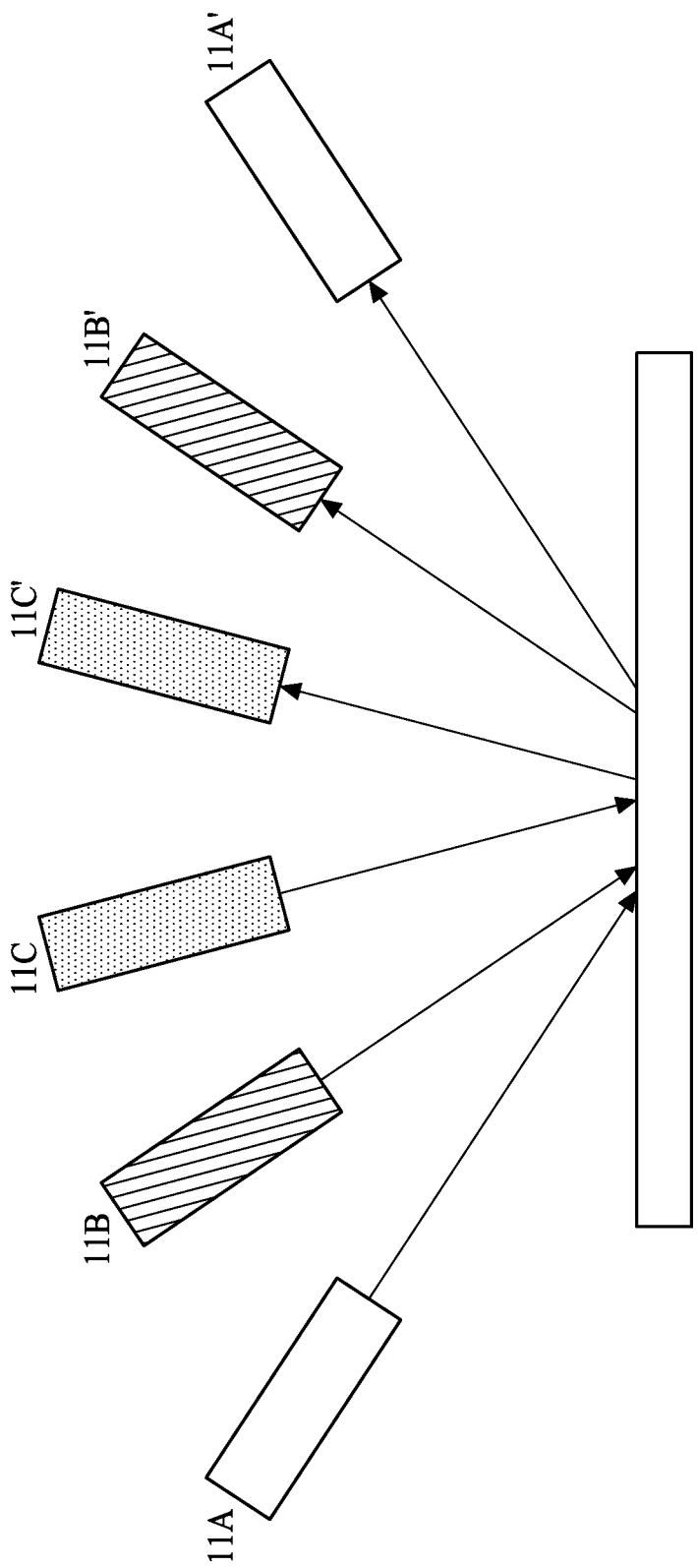
FIG. 11 is a perspective views showing a temperature measurement setting, in accordance with some embodiments of the present disclosure.

However, multiple zones on the substrate can be arranged with a manner other than a concentric pattern. For example, as shown in FIG. 10, the first zone 10A, the second zone 10B, and the third zone 10C are randomly picked under a check board division setting on the substrate and a first temperature T1, a second temperature T2, and a third temperature T3 are obtained. Moreover, the multiple temperatures measurement can be conducted by using a plurality of temperature sensors, as shown in FIG. 11. In FIG. 11, three sets of temperature sensors 11A/11A', 11B/11B', 11C/11C' are aimed at one zone on the substrate to obtain a first temperature T1, a second temperature T2, and a third temperature T3. However, in other embodiments, the temperature sensors 11A/11A', 11B/11B', 11C/11C are aimed at different zones on the substrate, as previously described. Controller then follows up averaging the multiple temperatures probed and calculating temperature difference by subtracting the predetermined temperature $T_{pre}$ from the average temperatures (T1+T2+T3)/3.

In some embodiments, operation 603 is conducted after operation 602 but can be either prior to or following operation 604 since dispensing liquid does not interfere with the determining function of a controller carrying out operation 604.

Figure 8:
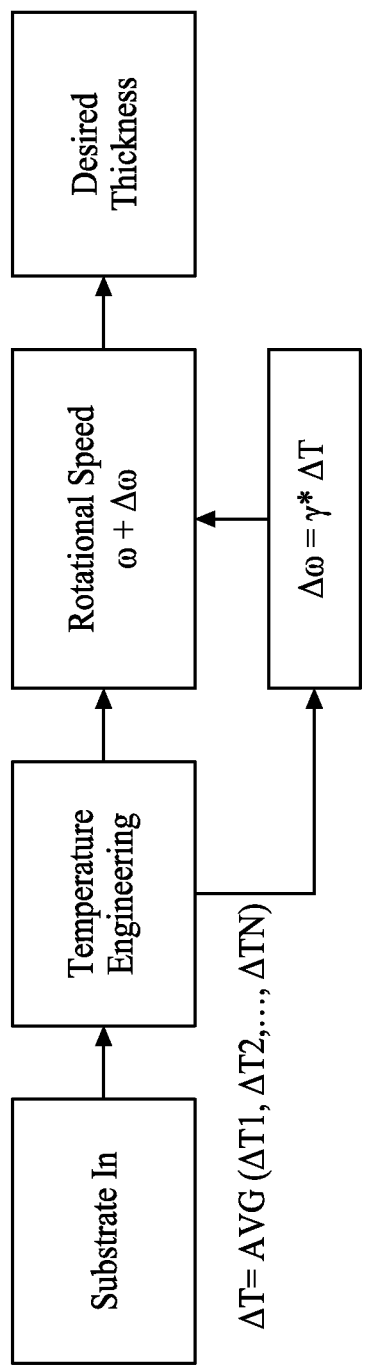
FIG. 8 is a block diagram showing a method for processing a substrate, in accordance with some embodiments of the present disclosure.

With reference to FIG. 8, the process flow 60 can be further illustrated in a block diagram. The temperature engineering operation corresponds to operation 602 to operation 604 as previously described and is not repeated here for brevity. As previously provided, once the temperature difference ΔT1 is obtained by subtracting the predetermined temperature $T_{pre}$ from the average temperatures (T1+T2+ . . . +TN)/N, where N is a positive integer, the corresponding coating thickness could be looked up. If the corresponding coating thickness is thicker than desired, increasing the predetermined rotational speed $\omega_{pre}$ by Δω can be mathematically determined. In the contrary, if the corresponding coating thickness is thinner than desired, decreasing the predetermined rotational speed $\omega_{pre}$ by Δω' can be mathematically determined. The correlation between the temperature difference ΔT1 and the rotational speed difference Δω can be formulated by the aforesaid equation Δω=γΔT, wherein γ is an empirical constant.

Some embodiments provide a substrate processing apparatus, including a rotatable pedestal configured to hold a substrate, a driving mechanism connected to the rotatable pedestal, a liquid pouring nozzle over the pedestal, a temperature sensor configured to probe a temperature of the substrate processing apparatus, and a controller communicating with the temperature sensor and the driving mechanism.

Some embodiments provide a method for processing a substrate, including providing a substrate on a pedestal of a processing chamber, probing a temperature of the processing chamber, calculating a temperature difference between the temperature of the processing chamber and a predetermined temperature, and determining a rotational speed difference with respect to a predetermined rotational speed of the pedestal according to the temperature difference.

Some embodiments provide a method for dispensing liquid on a substrate, including providing a substrate on a pedestal, probing a temperature of the substrate and calculating a temperature difference between the temperature of the substrate and a predetermined temperature, dispensing a liquid on the substrate, determining a rotational speed according to the temperature difference, and applying the rotational speed on the pedestal.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for processing a substrate, comprising:
   providing a substrate on a pedestal of a processing chamber;
   probing a temperature of the processing chamber;
   dispensing a liquid accumulating in a center region of a top surface of the substrate;
   calculating a temperature difference between the temperature of the processing chamber and a predetermined temperature;
   determining a rotational speed difference with respect to a predetermined rotational speed of the pedestal according to the temperature difference subsequent to a beginning of dispensing the liquid on the substrate, wherein the determining the rotational speed of the pedestal comprises: when the temperature of the processing chamber is determined to be greater than the predetermined temperature, generate a positive rotational speed difference proportional to a difference between the temperature of the processing chamber and the predetermined temperature;
   applying the rotational speed difference to the pedestal to achieve a spreading speed subsequent to dispensing the liquid on the substrate, wherein applying the rotational speed difference is performed prior to the liquid being spread over the entire top surface of the substrate; and
   applying a liquid drying speed to the pedestal subsequent to spreading the liquid over the entire top surface of the substrate, wherein the liquid drying speed is greater than the spreading speed.

2. The method of claim 1, wherein the probing the temperature of the processing chamber comprises probing a temperature of the substrate.

3. The method of claim 1, wherein the determining the rotational speed of the pedestal comprises:
   when the temperature of the processing chamber is determined to be lower than the predetermined temperature, generate a negative rotational speed difference.

4. The method of claim 1, wherein the liquid is dispensed on the substrate after probing the temperature of the processing chamber.

5. The method of claim 1, further comprising determining a viscosity of the liquid.

6. The method of claim 1, wherein applying the rotational speed difference to the pedestal comprises:
   accelerating the rotational speed of the pedestal at a constant rate to achieve the spreading speed prior to the liquid being spread over the entire top surface of the substrate; and
   maintaining the spreading speed for a predetermined period of time.

7. A method for dispensing liquid on a substrate, comprising:
   providing a substrate on a pedestal;
   probing a temperature of the substrate and calculating a temperature difference between the temperature of the substrate and a predetermined temperature;
   dispensing a liquid accumulating in a center region of a top surface of the substrate;
   determining a rotational speed according to the temperature difference subsequent to a beginning of dispensing the liquid on the substrate, wherein the determining the rotational speed of the pedestal comprises: when the temperature of the substrate is determined to be greater than the predetermined temperature, generate a positive rotational speed difference proportional to a difference between the temperature of the substrate and the predetermined temperature;
   applying the rotational speed difference on the pedestal to achieve a spreading speed subsequent to dispensing the liquid on the substrate, wherein applying the rotational speed difference is performed prior to the liquid being spread over the entire top surface of the substrate; and
   applying a liquid drying speed to the pedestal subsequent to spreading the liquid over the entire top surface of the substrate, wherein the liquid drying speed is greater than the spreading speed.

8. The method of claim 7, wherein the probing the temperature of the substrate comprises:
   probing a first temperature of the substrate in a first predetermined zone; and
   probing a second temperature of the substrate in a second predetermined zone different from the first predetermined zone.

9. The method of claim 8, wherein the first predetermined zone encloses a center of a substrate and the second predetermined zone circumferences the first predetermined zone.

10. The method of claim 8, further comprising averaging the first temperature and the second temperature of the substrate to obtain the temperature of the substrate.

11. The method of claim 7, wherein the determining a rotational speed of the pedestal comprises:
    correlating the temperature difference with a rotational speed difference; and
    adding the rotational speed difference to a predetermined rotational speed thereby obtaining the rotational speed of the pedestal.

12. The method of claim 7, wherein the dispensing the liquid on the substrate follows the probing the temperature of the substrate.

13. The method of claim 7, wherein the probing the temperature of the substrate comprises applying an infrared laser temperature sensor.

14. The method of claim 7, wherein the dispensing the liquid on the substrate comprises dispensing photoresist.

15. The method of claim 7, wherein the probing the temperature of the substrate comprises:
- probing a first temperature of a first concentric zone of the substrate;
- probing a second temperature of a second concentric zone of the substrate abutting the first concentric zone subsequent to probing the first temperature;
- probing a third temperature of a third concentric zone of the substrate abutting the second concentric zone subsequent to probing the second temperature; and
- obtaining an average temperature of the substrate based on the first temperature, the second temperature, and the third temperature.

16. A method for processing a substrate, comprising:
- applying a first rotational speed on the pedestal, the pedestal is configured to support the substrate;
- probing a temperature of the pedestal;
- calculating a temperature difference between the temperature of the pedestal and a predetermined temperature;
- dispensing a liquid accumulating in a center region of a top surface of the substrate;
- determining a second rotational speed according to the temperature difference by a controller subsequent to a beginning of dispensing the liquid on the substrate, wherein the determining the rotational speed of the pedestal comprises: when the temperature of the pedestal is determined to be greater than the predetermined temperature, generate a positive rotational speed difference proportional to a difference between the temperature of the pedestal and the predetermined temperature; and
- applying the second rotational speed on the pedestal by changing the first rotational speed to the second rotational speed subsequent to dispensing the liquid on the substrate, wherein applying the second rotational speed is performed prior to the liquid being spread over the entire top surface of the substrate;
- applying a liquid drying speed to the pedestal subsequent to spreading the liquid over the entire top surface of the substrate, wherein the liquid drying speed is greater than the second rotational speed.

17. The method of claim 16, wherein the liquid is dispensed over the pedestal after probing the temperature of the pedestal.

18. The method of claim 16, wherein probing the temperature of the pedestal comprises applying an infrared laser temperature sensor.

19. The method of claim 16, wherein determining the second rotational speed further comprises determining a viscosity of the liquid.

20. The method of claim 19, wherein determining the second rotational speed further comprises:
- manually inputting the determined viscosity into the controller;
- generating a correlation sheet of the rotational speed difference and the difference between the temperature of the pedestal and the predetermined temperature based on the viscosity of the liquid subsequent to manually inputting the determined viscosity; and
- referencing to the correlation sheet stored in a storage device communicatively coupled to the controller.

* * * * *